United States Patent
Abbott

(10) Patent No.: US 6,828,660 B2
(45) Date of Patent: Dec. 7, 2004

(54) SEMICONDUCTOR DEVICE WITH DOUBLE NICKEL-PLATED LEADFRAME

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 10/346,899

(22) Filed: Jan. 17, 2003

(65) Prior Publication Data

US 2004/0140539 A1 Jul. 22, 2004

(51) Int. Cl.$^7$ .................. H01L 23/495; H01L 23/12
(52) U.S. Cl. ............... 257/666; 257/762; 257/766; 257/767
(58) Field of Search ................. 257/666, 762, 257/766, 767, 764, 750, 741, 781, 787, 677, 761, 763, 700, 676, 736, 698

(56) References Cited

U.S. PATENT DOCUMENTS 5,540,378 A * 7/1996 Mahulikar et al.
5,643,434 A * 7/1997 Benmalek et al.
5,889,317 A * 3/1999 Huang et al.

OTHER PUBLICATIONS

Shinko Electric Ind. Co. Ltd., Patent Abstracts of Japan, Patent #3228789, Registration Date Jul. 9, 2001.

* cited by examiner

Primary Examiner—Long Pham
Assistant Examiner—DiLinh Nguyen
(74) Attorney, Agent, or Firm—W. Daniel Swayze, Jr.; W. James Brady; Frederick J. Telecky, Jr.

(57) ABSTRACT

A leadframe for use in the assembly of integrated circuit (IC) chips, which has first and second surfaces and a base metal structure (606) with an adherent layer (607) of nickel having a rough, non-reflecting surface covering the base metal. This rough nickel enhances adhesion to molding compounds. An adherent layer (608) of smooth, reflective nickel selectively covers the first surface of the leadframe in areas intended for attachment of bonding wires and the IC chip. This smooth nickel facilitates the use of vision systems. A first adherent metal layer (609) is deposited in selected areas of the first leadframe surface for wire bond attachment, and a second adherent metal layer (610) is deposited to provide attachment to external parts.

13 Claims, 3 Drawing Sheets

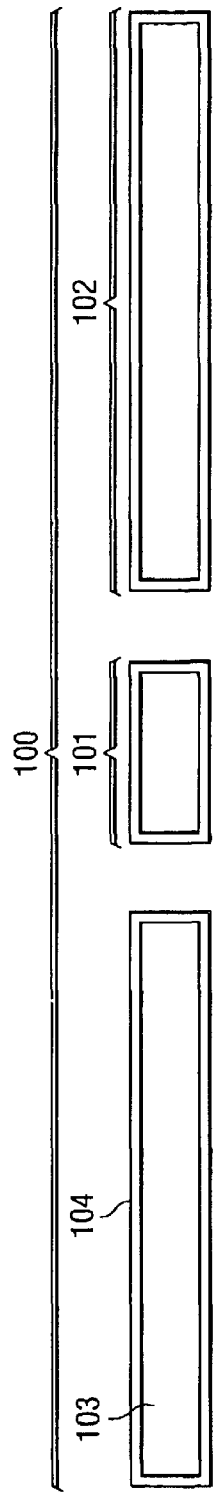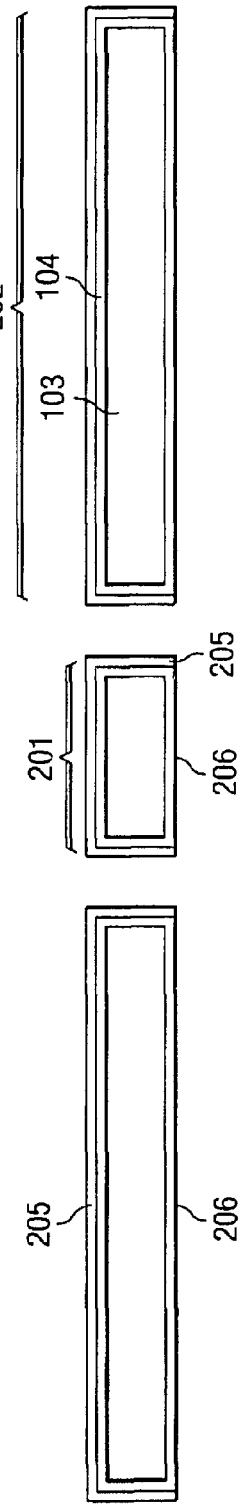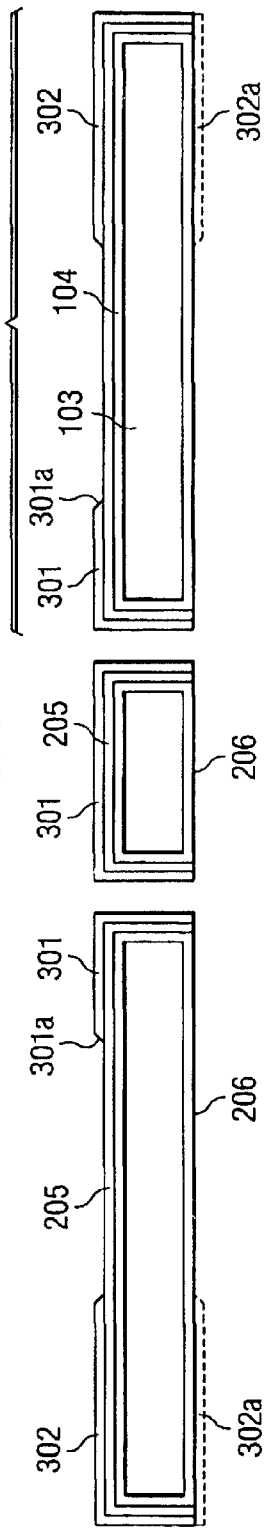

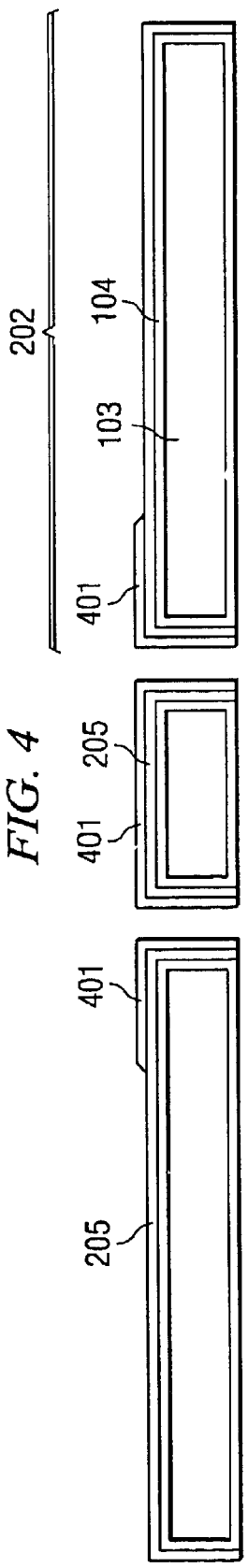
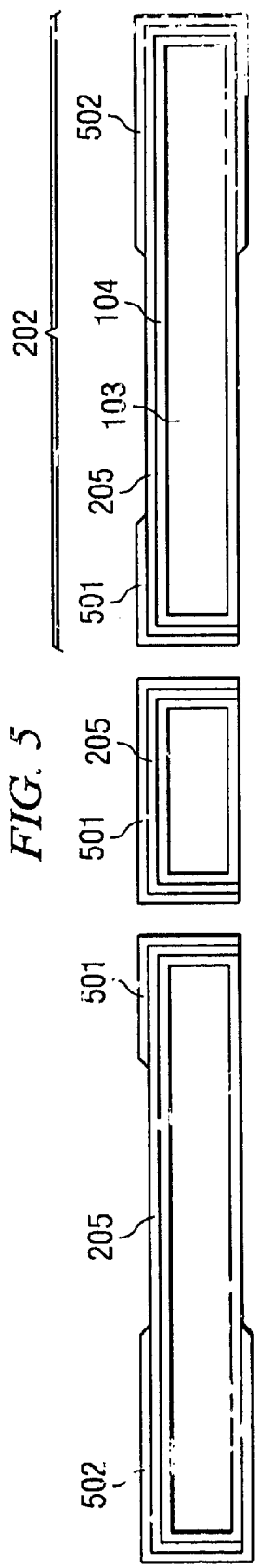
FIG. 4
FIG. 5

SEMICONDUCTOR DEVICE WITH DOUBLE NICKEL-PLATED LEADFRAME

FIELD OF THE INVENTION

The present invention is related in general to the field of semiconductor devices and processes, and more specifically to the materials and fabrication of leadframes for integrated circuit devices.

DESCRIPTION OF THE RELATED ART

Leadframes for semiconductor devices provide a stable support pad for firmly positioning the semiconductor chip, usually an integrated circuit (IC) chip within a package. Since the leadframe, including the pad, is made of electrically conductive material, the pad may be biased, when needed, to any electrical potential required by the network involving the semiconductor device, especially the ground potential.

In addition, the leadframe offers a plurality of conductive segments to bring various electrical conductors into close proximity of the chip. The remaining gap between the inner tip of the segments and the contact pads on the IC surface are typically bridged by thin metallic wires individually bonded to the IC contact pads and the leadframe segments.

Also, the ends of the lead segment remote from the IC chip ("outer" tips) need to be electrically and mechanically connected to external circuitry, for instance to assembly printed circuit boards. In the overwhelming majority of electronic applications, this attachment is performed by soldering, conventionally with lead-tin (Pb/Sn) eutectic solder at a reflow temperature in the 210 to 220° C. range.

Finally, the leadframe provides the framework for encapsulating the sensitive chip and fragile connecting wires. Encapsulation using plastic materials, rather than metal cans or ceramic, has been the preferred method because of low cost. The transfer molding process for epoxy-based thermoset compounds at 175° C. has been practiced for many years. The temperature of 175° C. for molding and mold curing (polymerization) is compatible with the temperature of 210 to 220° C. for eutectic solder reflow.

Reliability tests in moist environments require that the molding compound have good adhesion to the leadframe and the device parts it encapsulates. Two major contributors to good adhesion are the chemical affinity of the molding compound to the metal of the leadframe and the surface roughness of the leadframe. The recent general trend to avoid Pb in the electronics industry and use Pb-free solders, pushes the reflow temperature range into the neighborhood of about 260° C. This higher reflow temperature range makes it more difficult to maintain the mold compound adhesion to the leadframes required to avoid device delamination during reliability testing at moisture levels. Known leadframes do not offer metallization for good adhesion combined with low cost, easy manufacturability, and avoidance of whiskers.

It has been common practice to manufacture single piece leadframes from thin (about 120 to 250 $\mu$m) sheets of metal. For reasons of easy manufacturing, the commonly selected starting metals are copper, copper alloys, and iron-nickel alloys (for instance the so-called "Alloy 42"). The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

Nickel plating of the leadframe starting metal has been shown to be desirable because nickel reduces the propensity for tin dendrite/whisker growth in devices with tin-plated leads, a generally feared failure phenomenon. Nickel, however, has poor adhesion to most molding compounds. Therefore, it is typically coated with a thin layer of palladium or gold. The pressure of cost reduction, though, in semiconductor manufacturing requires that noble metals be used cautiously.

A need has therefore arisen for a low cost, reliable leadframe combining adhesion to molding compounds, bondability for connecting wires, pro-plating of tin, and avoiding the risk of tin whisker growth. The leadframe and its method of fabrication should be low cost and flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

One embodiment of the invention is a leadframe for use in the assembly of integrated circuit (IC) chips, which has first and second surfaces. The leadframe includes a base metal structure with an adherent layer comprising nickel having a rough, non-reflecting surface covering the base metal. This rough nickel enhances adhesion to molding compounds. Adhering to the rough nickel layer is a layer comprising smooth, reflective nickel, selectively covering the first surface of the leadframe in areas intended for attachment of bonding wires and the IC chip. This smooth nickel supports vision systems in wire bonders and the pick-and-place machines.

In another embodiment of the invention, a further adherent layer of metal is deposited in selected areas of the first leadframe surface to provide attachment of bonding wires as well as attachment to external parts.

In another embodiment of the invention, an adherent metal layer suitable for wire bond attachment is deposited in the region for wire bonding. Then, the transfer molding process is performed. Finally the external leads of the molded device are plated with a metal or alloy suitable for attachment to external parts.

In another embodiment of the invention, a first adherent metal layer is deposited on the leadframe in selected areas for wire bond attachment, and a second adherent metal layer is deposited to provide attachment to external parts.

Embodiments of the present invention are related to high density ICs, especially those having high numbers of inputs/outputs, or contact pads, and also to devices in packages requiring surface mount in printed circuit board assembly. These ICs can be found in many semiconductor device families such as standard linear and logic products, digital signal processors, microprocessors, wireless devices, digital and analog devices, and both large and small area chip categories. The embodiments provide a significant cost reduction, provide improved adhesion to molding compounds and manufacturability in wire bonding, suppress tin whisker formation, and enhance environmental protection and assembly flexibility of semiconductor packages, especially the plastic molded packages, compared to the conventional copper-based solder-plated leadframes.

It is a technical advantage of one or more embodiments of the invention that the embodiments can reach the goals of the invention with a low-cost manufacturing method without the cost of equipment changes and new capital investment, by using the installed fabrication equipment base.

Another advantage which may flow from one or more embodiments of the invention is to produce leadframes so that established wire bonding processes can continue unchanged, and that established board attachment process can continue unchanged. As an example, in one embodiment the leadframes prepared according to the invention can be successfully used in surface mount technologies based on bending the package lead segments. Embodiments of the invention generally apply to semiconductor package types such as PDIPs, SOICs, QFPs, SSOPs, TQFPs, TSSOPs, TVSOPs, and Ball Grid Array devices employing leadframes.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a schematic and simplified cross sectional view of a leadframe with base metal and a first plated layer.

FIG. 2 is a schematic and simplified cross sectional view of a leadframe after plating the second layer.

FIG. 3 is a schematic and simplified cross sectional view of a leadframe after plating the layers for wire bond attachment and external parts attachment according to an embodiment of the invention.

FIG. 4 is a schematic and simplified cross sectional view of a leadframe after plating the layers for wire bond attachment and external parts attachment according to another embodiment of the invention.

FIG. 5 is a schematic and simplified cross sectional view of a leadframe after plating the layers for wire bond attachment and external parts attachment according to yet another embodiment of the invention.

DETAILED DESCRIPTION OF THE PREFERRED EMBODIMENTS

Figure 6:
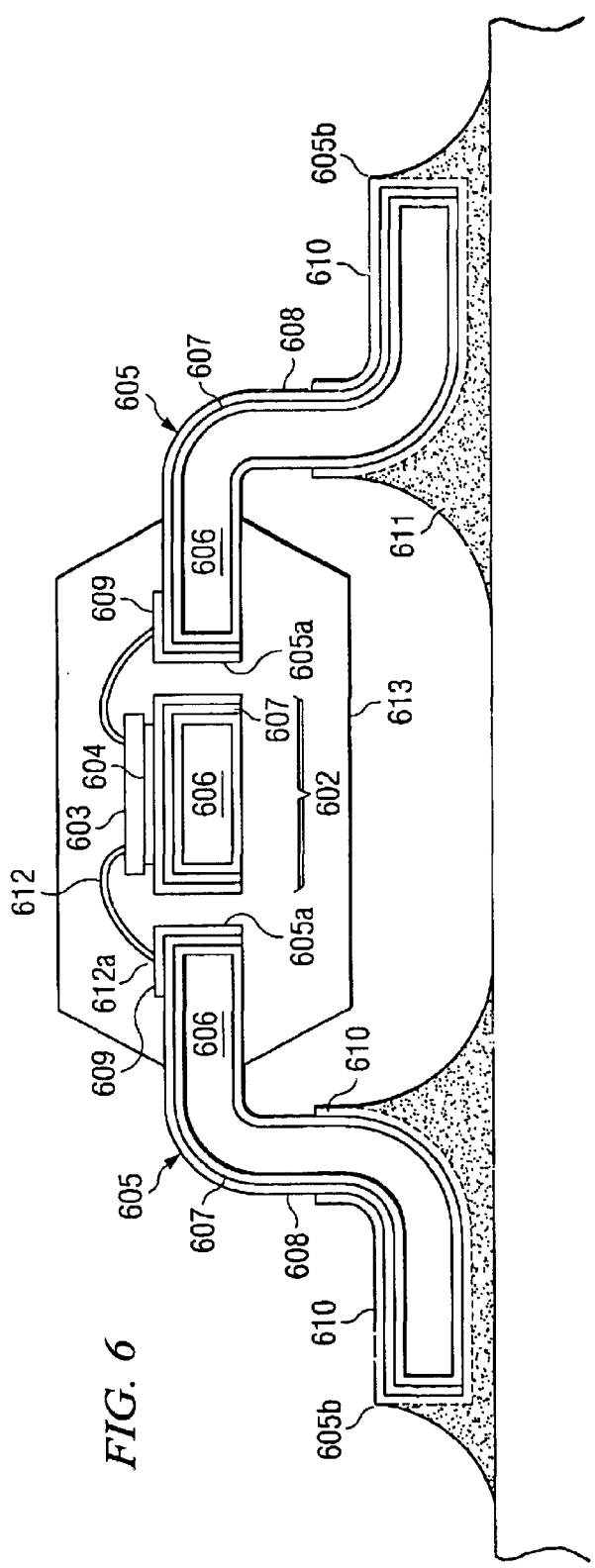
FIG. 6 is a schematic and simplified cross sectional view of a packaged gull-wing semiconductor device, reflow assembled on a substrate.

FIG. 1 is a schematic and simplified cross section of a leadframe portion, generally designated 100, and shows the chip mount pad 101 and a plurality of lead segments 102. The leadframe is made of a base metal 103 fully covered with a plated layer 104.

As defined herein, the starting material of the leadframe is called the "base metal", indicating the type of metal. Consequently, the term "base metal" is not to be construed in an electrochemical sense (as in opposition to 'noble metal') or in a structural sense.

Base metal 103 is typically copper or copper alloys. Other choices comprise brass, aluminum, iron-nickel alloys ("Alloy 42"), and invar.

Base metal 103 originates with a metal sheet in the preferred thickness range from 100 to 300 μm; thinner sheets are possible. The ductility in this thickness range provides the 5 to 15% elongation that facilitates the segment bending and forming operation. The leadframe is stamped or etched from the starting metal sheet.

The plated layer 104 comprises rough, non-reflective nickel having a thickness between 0.2 and 1.0 μm, preferably 0.5±25 μm. Nickel is the preferred metal because, positioned under the tin-based solder of contemporary devices, it reduces the propensity for tin whiskers. This rough nickel is sometimes referred to as "TN nickel".

Nickel layer 104 has a rough surface structure that includes clusters of small particles ranging in diameter from 300 to 600 nm, for example, with an occasional larger cluster. These are ordered randomly with no apparent alignment. The total vertical range of the surface is preferably approximately 700 nm. The mean deviation values (height distribution with respect to the mean surface plane) are preferably between about 60 and 80 nm. The roughness of the nickel surface promotes adhesion between the nickel-plated leadframe and the molding compounds used for encapsulating semiconductor devices.

Plated layer 104 is ductile for the leadframe segment bending and forming process. However, due to its rough surface, nickel layer 104 is visually very dull and non-reflective. Consequently, it complicates the vision systems of automated semiconductor assembly steps requiring image recognition or alignments.

In contrast to the rough nickel, smooth nickel has a total vertical range of the surface of only about 200 to 350 nm with a mean deviation of about 30 nm. Smooth nickel, commonly sulfamate nickel, does not adhere well to molding compounds. Therefore, it is typically covered with an additional adherent thin layer of palladium, gold, or alloys thereof, which promote adhesion to molding compounds.

In FIG. 2, layer 205 of additional nickel (sulfamate nickel) is plated on the leadframe, but only on the side intended for chip mounting and wire bonding. Consequently, this nickel covers the chip mount pad 201 and the segments 202.

For the plating process of nickel layer 205 onto only one side of the leadframe, the opposite side 206 is masked during the plating process. This additional nickel layer 205, sulfamate nickel for example, has a smooth surface and thus restores the reflective surface characteristic useful for vision systems in automated assembly steps. The thickness of layer 205 is preferably less than 0.5 μm, preferably in the range from 0.125 to 0.375 μm. In this thickness range, sulfamate nickel smoothes the rough nickel surface of layer 104 to make it more reflective. Nickel layer 205 is ductile for the leadframe bending and forming process. Further, nickel layer 205 (as well as layer 104) is wettable in the soldering process, so that tin or solder alloys can be used successfully.

In FIG. 3, adherent layers 301 and 302 of metal are deposited in selected areas of the leadframe side, which is intended for bonding wire attachment. Layer 301 covers the areas designated for chip attachment and wire bond attachment, and layer 302 covers the areas for attachment to external parts. For some applications, the areas 302, located on the outer part of segment 202, may be extended in an extra plating step to include areas 302a in order to facilitate attachment to external parta using solder.

The metal for layers 301 and 302 (and 302a) may, for example, be palladium, gold, platinum, silver, rhodium, or nickel as single metals or as alloys. These metals also have an affinity to molding compounds. The thickness of layers 301 and 302 is preferably in the range from 20 to 60 nm, but could, for cost reduction reasons, possibly be reduced to 10 to 30 nm. For many leadframe applications, the lateral extension of layer 301 along segment 202 to the boundary 301a is determined by the technical requirement of attaching bonding wires to the leadframe. In the majority of wire bonding applications, the wire is attached by stitch bonding to layer 301. For stitch bonding, loose tolerances of boundary 301a are acceptable.

FIG. 4 describes an embodiment of the invention wherein the reflowable material is deposited on the outer lead segments only after the device molding process. In contrast, FIG. 5 describes an embodiment wherein the solderable material is deposited on the outer lead segments already before the device molding process ("pre-plated" leadframe). Examples of solderable materials include reflowable materials (for example, tin or tin alloys) and materials which either render the lead surface wettable (for example, gold) or dissolve, at least partially, in the solder paste during the attachment process (for example, palladium).

In FIG. 4, an adherent layer of metal is deposited only in the areas 401 selected for bonding wire attachment. The metal is preferably palladium, silver, gold, or an alloy thereof. The preferred choices are palladium for thin layers (between 20 an 60 nm) and silver for thick layers (between 200 and 600 nm).

For this embodiment, the outer parts of the segments 202 receive their coverage with reflowable material (commonly tin or tin alloys) after the molding process of the semiconductor device. Two techniques are being practiced in the industry for the post-molding solder application: Solder plating or solder dipping.

A preferred technique of preparing the outer ends of the leadframe segments for device reflow attachment is the method of pre-plating the leadframe before the device assembly and molding steps. FIG. 5 describes an embodiment of the invention including the preplating method. An adherent layer (designated 501 in FIG. 5) of a first metal is deposited in selected areas of that leadframe side, which is intended for bonding layer attachment. The first metal is selected to provide attachment of bonding wires; preferred choices include palladium, silver, gold, and alloys thereof. An adherent layer (designated 502 in FIG. 5) of a second metal is deposited in selected areas of the leadframe segment 202; the selected area includes the segment part intended for attachment to external parts. The second metal can be chosen from a wide group of reflowable materials; examples are tin, tin alloys including tin/copper, tin/indium, tin/silver, tin/bismuth, tin/lead, indium, and conductive adhesive compounds. Layer 502 provides a "solder-preplated" leadframe, especially a tin-preplated leadframe with low propensity for whiskering. Alternatively, the second metal can be chosen from a group of solderable materials, for instance gold, palladium, or silver.

Whisker growth is inhibited by the nickel layer 205, which is a diffusion barrier for the base metal 103 and keeps the base metal out of the layer 502 and the subsequent solder joint. Further helpful for suppressing whisker growth is a matte, coarse grain of the preplated layer 502, and a low carbon content composition. An important contribution is further the fact that the layer 502 receives, due to its preplating deposition before the molding encapsulation process, a thorough annealing step during the extended molding compound polymerization period ("curing"; commonly at 175° C. for 5 to 6 hr). It is a technical advantage of the invention that this annealing step is provided without any additional time or cost during the assembly process.

The selective metal deposition of the layer 502 onto the leadframe uses an inexpensive, temporary masking step, which leaves only those leadframe portions exposed which are intended to receive the metal layer. Because of the fast plating time, conventional selective spot plating techniques can be considered, especially reusable rubber masks. For thin metal plating, a wheel system is preferred as described below.

There are several methods to selectively deposit metals from solution onto a continuous strip. For high volume production of leadframes, continuous strip or reel-to-reel plating is advantageous and common practice. For applications where loose tolerances are acceptable for the boundaries of the metal layer plating on the inner ends of the lead segments, the preferred deposition method for the present invention is the so-called "wheel system".

In the wheel system, material is moved over a large diameter wheel with apertures in it to allow solution flow to material. These apertures define the locations for plating and index pins engage the pilot holes in the leadframe. A backing belt is used to hold material on the wheel and a mask on the backside of the material. The anode is stationary inside the wheel. Among the advantages of the wheel system are a fast operating speed, since the material never stops for selective plating. There are no timing issues, and the pumps, rectifiers, and drive system are on continuously. The wheel system is low cost because the system is mechanically uncomplicated. However, the boundaries of plated layers are only loosely defined. A more precise, but also more costly and slower selective plating technique is the step-and-repeat process.

In the step-and-repeat system, the leadframe material is stopped in selective plating heads. A rubber mask system clamps on the material-to-be-plated. A plating solution is jetted at the material. Electrical current is applied and shut off after a pre-determined period of time. Then, the solution is shut off and the head opens. Thereafter, the material moves on. Among the advantages of the step-and-repeat system are a very sharp plating spot definition with excellent edges, further a very good spot location capability when used with index holes, pins and feedback vision system.

Figure 7:
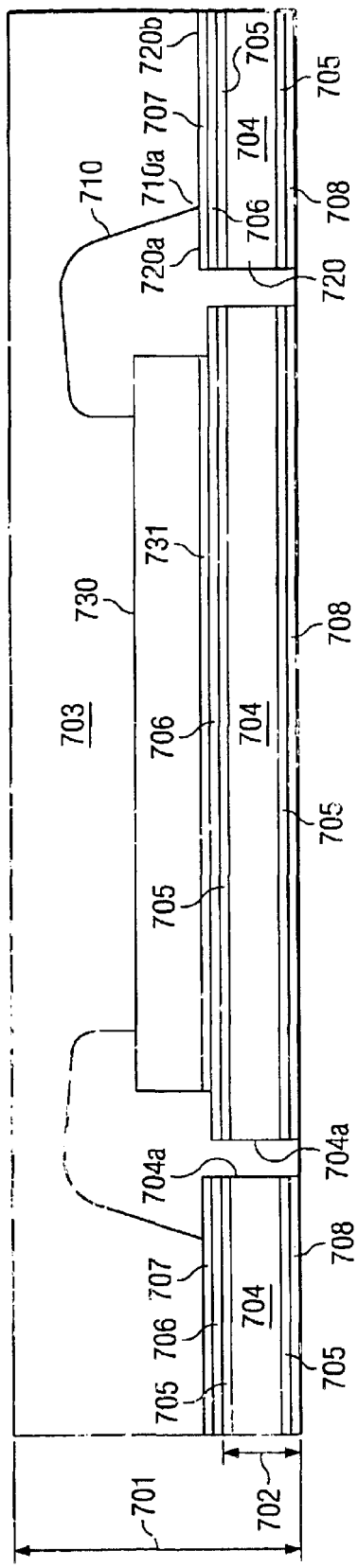
FIG. 7 is a schematic and simplified cross sectional view of a packaged no-lead semiconductor device.

FIGS. 6 and 7 illustrate examples of semiconductor device applications of leadframes incorporating an embodiment of the invention. Both examples are molded surface mount devices, FIG. 6 is a small outline package with gull-wing shaped outer lead segments, FIG. 7 a small outline no-lead device.

In the schematic cross section of FIG. 6, the leadframe (for example copper or copper alloy) has a chip mount pad 602 onto which an IC chip 603 is attached using adhesive material 604 (typically an epoxy or polyimide which has to undergo polymerization). The leadframe further has a plurality of lead segments 605. These lead segments have a first end 605a near the chip mount pad 602 and their second end 605b remote from mount pad 602.

As shown in FIG. 6 schematically, the leadframe comprises base 606, preferably made of copper or copper alloy. On the surface of this base is a sequence of layers, described above in detail in reference to FIG. 5. Closest to the copper is a first layer 607 of rough-surface nickel. This layer 607 is followed, on the leadframe side intended for wire bonding, by layer 608 of smooth nickel. Next, in selected areas, is a layer 609 of bondable metal (for instance, palladium) and a layer 610 of reflowable metal (for instance, tin). This layer 610 is incorporated into the meniscus of the bulk solder 611 in the process of surface mounting the small-outline device onto a substrate or board.

In FIG. 6, bonding wires 612 have stitches 612a welded to the bondable surface 609 of the first ends 605a of leadframe segments 605. The bonding wires may be chosen, for example, from gold, copper, aluminum, and alloys thereof, or other suitable electrically conductive interconnections. Any of these metals provide reliable welds to the layered leadframes of the invention.

As shown in FIG. 6, the second ends 605b of segments 605 are suitable for bending and forming due to the ductility of the copper base and the plated nickel layers. In general, copper leads plated with the rough nickel and smooth nickel of the invention have better trim/form performance than leads plated with the traditional lead/tin alloy due to improved ductility. Because of this malleability, segments 605 may be formed in any shape required for surface mounting or any other technique of board attachment of the semiconductor devices. The bending of the segments does not diminish the corrosion protection of the second segment ends 605b. For example, FIG. 6 indicates a so-called "gull wing shape" of segments 605.

In FIG. 6, solder attach material 611 comprises, for example, a solder paste; this paste may dissolve the plated layer 610 (indicated by the dashed lines in FIG. 6), resulting in good wetting characteristics of the plated nickel surface of the leadframe. In FIG. 6, molding compound 613 encapsulates the mounted chip 603, bonding wires 612 and the first ends 605a of the lead segments 605. The second, remote ends 605b of the segments are not included in the molded package; they remain exposed for solder attachment. Typically, the encapsulation material 613 is an epoxy-based molding compound suitable for adhesion to the leadframe surfaces.

Leadframes fabricated with the plated layers according to embodiments of the invention have an advantage for visual inspection. The smooth nickel as well as the palladium layers can be seen on the surface of the rough, non-reflective nickel-plated leadframes by cursory visual control—a low cost benefit for manufacturing process control.

The cross sectional side view of FIG. 7 illustrates an embodiment of the invention for a semiconductor small outline no-lead device. The device, generally designated 700, has been transfer molded to a total thickness 701 of about 0.8 mm, of which the leadframe sheet contributes a thickness 702 of about 0.1 mm and the encapsulation material 703 (preferably a molding compound) the remainder of 0.7 mm. The leadframe base metal 704 is preferably copper or copper alloy. The base material 704 has been plated before the stamping step. When the metal sheet is stamped in the leadframe production, the base metal is exposed to the molding material 703 on all edges 704a, which have been created by the stamping process of the leadframe structure. Copper or copper alloy, the typical metals of the leadframe, have been demonstrated to give superior mold compound adhesion to most mold compound used in the fabrication of IC devices.

Following the sequence of deposited metal layers described in reference to FIGS. 1 to 5, FIG. 7 shows the rough (for instance TN) nickel layer 705, the smooth (for instance sulfamate) nickel layer 706, the bondable layer (preferably palladium; other choices include ruthenium and silver) 707, and the solderable layer (examples include tin or palladium) 708. If palladium is chosen for layer 707, a suitable thickness for reliable wire bonding is 20 to 60 nm; the thickness could possibly be reduced to 10 to 30 nm. In the thickness range 20 to 60 nm, palladium is suitable for all wire bonding attachments (stitch bonds, ball bonds, and wedge bonds) and retains its excellent adhesion to thermoplastic molding compounds—an attribute crucial for avoiding package delamination and progressive corrosion.

As can be seen in FIG. 7, the plated layer 708 of solderable material is available on all leadframe portions facing the "outside world" for solder attachment to other parts. When a pure tin or solder alloy is chosen as plating material, the layer thickness is in the range from about 3 to 25 µm. Alternatively, when palladium is chosen, the layer thickness is in the range from 60 to 180 nm.

As reflowable materials, layer 708 may, for example, comprise tin, tin alloys such as tin/copper, tin/indium, tin/silver, and tin/bismuth, indium, tertiary alloys (also containing gallium), and conductive adhesive compounds. A preferred easy-to-plate solder alloy is a binary tin and copper alloy; a tin and silver alloy is another preferred solder. The composition is optimized to bring the reflow temperature above the temperatures seen at the various assembly steps (chip attach, wire bonding, molding, curing), which vary from device to device. For example, if 270° C. is the target, 2.5 weight % copper is appropriate in the tin/copper alloy; if 300° C. is the target, 5.0 weight % copper is appropriate. The tin/copper, or tin/silver alloy does not need to melt, but will rather dissolve into the solder paste, offering good wetablilty of the underlying nickel.

In FIG. 7, bonding wires 710 have stitches 710a welded to the palladium surface of the first ends 720a of leadframe segments 720. The bonding wires are preferably made of gold, copper, aluminum, and alloys thereof. Any of these metals provide reliable welds to the layered leadframes of the invention.

With the outer leadframe surface plated with layer 708 preferably made of tin, palladium, or palladium/gold, the embodiment of the invention provides for easy and reliable solder attachment to boards or other external parts. When solder pastes are used, the paste may dissolve the plated tin or palladium layer, resulting in good wetting characteristics to the plated rough nickel surface of layer 705 of the metal leadframe.

In FIG. 7, molding compound 703 encapsulates the chip 730 mounted by adhesive layer 731, bonding wires 710 and at least the first ends 720a of the lead segments 720. The second, remote ends 720b of the segments may or may not be encapsulated, dependent on the device type. Typically, the encapsulation material 703 is selected from epoxy-based molding compounds suitable for adhesion to the leadframe surfaces. For rough nickel and palladium, excellent adhesion characteristics to molding compounds can be achieved, preventing package delamination, moisture ingress and corrosion.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing.

As another example, the process step of stamping the leadframes from a sheet of base metal may be followed by a process step of selective etching, especially of the exposed base metal surfaces in order to create large-area contoured surfaces for improved adhesion to molding compounds.

It is therefore intended that the appended claims encompass any such modifications or embodiments.

I claim:

1. A leadframe having first and second surfaces, comprising:

a base metal structure;

an adherent layer comprising nickel having a rough, non-reflectlve surface covering said base metal; and an adherent layer comprising smooth, reflective nickel on said rough nickel layer, selectively covering areas of said first leadframe surface intended for attachment of bonding wires and a chip.

2. The leadfrarne according to claim 1 further comprising an adherent layer of at least one metal in selected areas of said first surface, said at least one metal selected to provide attachment of bonding wires.

3. The leadframe according to claim 2 further comprising an adherent layer of at least one metal in leadframe areas selected for attachment to external parts, said at least one metal selected to provide attachment to external parts.

4. The leadframe according to claim 3 wherein said at least one metal is selected from a group consisting of tin, tin alloys including tin/copper, in/indium, tin/silver, tin/bismuth, tin/lead, indium, and conductive adhesive compounds.

5. The leadframe according to claim 2 wherein said at least one metal providing attachment to bonding wires is selected from a group consisting of palladium, gold, platinum, silver, and alloys thereof.

6. The leadframe according to claim 1 wherein said base metal is copper, copper alloy, aluminum, iron-nickel alloy, or invar.

7. The leadframe according to claim 1 wherein said rough nickel layer comprises randomly ordered clusters of particles ranging in diameter from about 300 to 600 nm.

8. The leadframe according to claim 1 wherein said rough nickel layer comprises a total vertical range between peak and trough of the surface of approximately 700 nm with a mean height distribution of about 60 to 80 nm.

9. The leadframe according to claim 1 wherein said smooth nickel layer comprises a total vertical range between peak and trough of th surface of approximately 200 to 350 nm with a mean height distribution of about 30 nm.

10. The leadframe according to claim 1 wherein said selective areas of said reflective nickel layer are all on only one surface of said leadframe.

11. A semiconductor device, comprising:

a leadframe having first and second surfaces and further comprising a chip mount pad and a plurality of lead segments, each said segment having a first end near said mount pad and a second end remote from said mount pad;

said leadframe comprising a base metal and a first adherent layer of nickel having a rough, non-reflective surface;

said leadframe further comprising a second layer of smooth, reflective nickel on said first rough nickel layer, said second nickel layer selectively covering said first surface;

an integrated circuit chip attached to said mount pad;

bonding wires interconnecting said chip and said first ends of said lead segments;

encapsulation material covering said chip, bonding wires and said first ends of said lead segments, and a layer of solderable material on said rough nickel layer, selectively covering at least said second ends of said lead segments.

12. The device according to claim 11 wherein said rough nickel layer comprises randomly order d clusters of particles ranging in diameter from about 300 to 600 nm, providing a total vertical range between peak and trough of the surface of approximately 700 nm with a mean height distribution of about 60 to 80 nm.

13. The device according to claim 11 wherein said smooth nickel layer comprises a total vertical range between peak and trough of the surface of approximateiy 200 to 350 nm with a mean height distribution of about 30 nm.

* * * * *